(12) United States Patent
Gao et al.

(10) Patent No.: US 10,971,380 B2
(45) Date of Patent: Apr. 6, 2021

(54) DE-BONDING LEVELING DEVICE AND DE-BONDING METHOD

(71) Applicant: SHANGHAI MICRO ELECTRONICS EQUIPMENT (GROUP) CO., LTD., Shanghai (CN)

(72) Inventors: Yuying Gao, Shanghai (CN); Wei Wei, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 205 days.

(21) Appl. No.: 16/321,682

(22) PCT Filed: Jul. 27, 2017

(86) PCT No.: PCT/CN2017/094765
§ 371 (c)(1),
(2) Date: Jan. 29, 2019

(87) PCT Pub. No.: WO2018/019276
PCT Pub. Date: Feb. 1, 2018

(65) Prior Publication Data
US 2020/0090961 A1    Mar. 19, 2020

(30) Foreign Application Priority Data

Jul. 29, 2016 (CN) .......................... 201610617042.9

(51) Int. Cl.
*B32B 43/00* (2006.01)
*H01L 21/67* (2006.01)
*B32B 38/10* (2006.01)

(52) U.S. Cl.
CPC ...... *H01L 21/67092* (2013.01); *B32B 43/006* (2013.01); *B32B 38/10* (2013.01);
(Continued)

(58) Field of Classification Search
CPC ..... B32B 38/10; B32B 43/006; Y10T 156/11; Y10T 156/1179; Y10T 156/19; Y10T 156/1983
See application file for complete search history.

(56) References Cited

U.S. PATENT DOCUMENTS 5,310,157 A * 5/1994 Platus ..................... F16F 3/026
                                                         248/619
5,622,362 A * 4/1997 Shiiki .................. B65H 3/0816
                                                         271/106
(Continued)

FOREIGN PATENT DOCUMENTS

CN        101059595 A    10/2007
CN        102854751 A    1/2013
(Continued)

*Primary Examiner* — Mark A Osele
*Assistant Examiner* — Nickolas R Harm
(74) *Attorney, Agent, or Firm* — Muncy, Geissler, Olds & Lowe, P.C.

(57) ABSTRACT

A debonding leveling device and a debonding method are for leveling during a process for debonding a first object and a second object. The first and second objects are retained by a first fixation plate (11) and a second fixation plate (21), respectively. The device includes: a mounting plate (30), disposed at an outer side of one of the first (11) and second (21) fixation plates; a connecting rod assembly (40) fixed around a center position of the mounting plate (30), the connecting rod assembly (40) connected to the one of the first (11) and second (21) fixation plates sequentially via a sliding pair (50) and a spherical pair (60) connected to the sliding pair (50); and at least three elastic assemblies (70) disposed between the mounting plate and the one of the first and second fixation plates, each of the elastic assemblies coupled to the mounting plate (30) and the one of the first (11) and second (21) fixation plates. The combination of the spherical pair and the sliding pair allows an adaptation of (Continued)

leveling objects to dynamic changes of the reference, and the elastic assemblies performs a leveling for the leveling objects in real-time based on an orientation of the reference. This entails a simple structure with a reasonable layout, which is easy to use in practice and is particularly helping in dynamic leveling applications without requiring an active control.

12 Claims, 2 Drawing Sheets

(52) U.S. Cl.
CPC ........ *Y10T 156/11* (2015.01); *Y10T 156/1179* (2015.01); *Y10T 156/19* (2015.01); *Y10T 156/1983* (2015.01)

(56) References Cited

U.S. PATENT DOCUMENTS

| | | | | |
|---|---|---|---|---|
| 5,676,364 | A * | 10/1997 | Shiiki | B65H 3/0816 271/106 |
| 6,355,994 | B1 * | 3/2002 | Andeen | G03F 7/70716 248/550 |
| 7,044,056 | B2 * | 5/2006 | Miyoshi | B65H 3/0833 101/477 |
| 8,470,129 | B1 * | 6/2013 | Wang | H01L 21/6838 156/705 |
| 2004/0166653 | A1 * | 8/2004 | Kerdiles | H01L 21/68707 438/458 |
| 2006/0286769 | A1 * | 12/2006 | Tsuchiya | H01L 21/6838 438/458 |
| 2010/0155560 | A1 * | 6/2010 | Makino | H02K 41/031 248/346.01 |
| 2011/0010908 | A1 * | 1/2011 | George | B32B 43/006 29/426.2 |
| 2011/0198040 | A1 * | 8/2011 | Ebata | B65H 41/00 156/750 |
| 2013/0292062 | A1 * | 11/2013 | Iwashita | H01L 21/6838 156/750 |
| 2014/0061989 | A1 * | 3/2014 | Zhang | G02F 1/1303 269/37 |
| 2014/0374031 | A1 | 12/2014 | Chiou et al. | |
| 2015/0217556 | A1 * | 8/2015 | Lee | G02F 1/1303 156/702 |
| 2015/0217557 | A1 * | 8/2015 | Lee | B32B 43/006 156/707 |
| 2015/0319893 | A1 * | 11/2015 | Ohno | B32B 43/006 156/702 |
| 2016/0111316 | A1 | 4/2016 | Huang et al. | |
| 2016/0176181 | A1 * | 6/2016 | Kim | B32B 38/10 156/701 |
| 2018/0108558 | A1 * | 4/2018 | Yin | B32B 43/006 |

FOREIGN PATENT DOCUMENTS

| | | |
|---|---|---|
| CN | 2559457 Y | 7/2013 |
| CN | 103579042 A | 2/2014 |
| CN | 103839862 A | 6/2014 |
| CN | 104062854 A | 9/2014 |
| CN | 105047589 A | 11/2015 |
| CN | 205380975 U | 7/2016 |
| JP | 2000-228463 A | 8/2000 |

* cited by examiner

DE-BONDING LEVELING DEVICE AND DE-BONDING METHOD

TECHNICAL FIELD

The present invention relates to the field of semiconductor technology and, in particular, to a leveling device for use in debonding and a corresponding debonding method.

BACKGROUND

In today's era of big data, the semiconductor industry is growing and expanding rapidly, constantly impacting every aspect of the society, including automotive, industrial, medical, network, mobile communications, consumer electronics and etc.

Modern society is now undergoing revolutionary changes. In the semiconductor industry, wafer fabrication is a vital part and larger production capacities are always pursued.

Debonding is an important step in a wafer fabrication process and is targeted to separate a wafer that is bonded to a glass substrate. During debonding, the wafer and the glass substrate are individually retained, and an external force is then applied to one of them along a bonding surface of the wafer and the glass substrate so that the wafer and the glass substrate are separated from each other. As shown in FIG. 1, a bonded wafer comprises a silicon wafer 10 and a glass substrate 20. The silicon wafer 10 and the glass substrate 20 are fixed by a first fixation plate 11 and a second fixation plate 21, respectively. During debonding, a force F is exerted on one of them until the silicon wafer 10 is completely separated from the glass substrate 20, as shown in FIG. 2. During their separation, the silicon wafer 10 and the glass substrate 20 must be kept in parallel to each other. Otherwise, damage may result due to progressively increasing squeezing pressure. There are mainly two factors that may destroy the parallelism: 1) residual errors remaining from system commissioning; and 2) geometric irregularities in the wafer, which occur randomly and vary dynamically, and thus a leveling device is required to perform an adjustment. Although a conventional mechanical leveling device can solve the problem of residual errors, as only one attitude can be maintained after adjusting, the device is typically incapable of a real-time leveling during a whole separation process. Although a real-time monitoring can be achieved by using photoelectric sensors forming a closed-loop system, it tends to be too expensive, so that the device may lose its competitiveness in the market.

Chinese Patent No. CN2559457Y, issued on Jul. 9, 2003, discloses a three degree of freedom (3-DOF) mechanism capable of rotating in both the Rx- and Ry-directions with the aid of three sliding pairs, three spherical pairs, one revolute pair and one 2-DOF universal joint and translating in the Z-direction with the aid of three sliding pairs. During rotation of an upper platform in the Rx- or Ry-direction, only one of the kinematic pairs positioned at the right-angle vertex of a right triangle remains horizontally stationary. In order to maintain the upper platform horizontally stationary relative to a lower platform, the right-angle vertex of the right triangle needs to be aligned with geometric centers of the two platforms. As such, the 3-DOF mechanism assumes an eccentric configuration. In the disclosed structure of this patent, in order to achieve a 3-DOF movement, the kinematic pairs on the upper and lower platforms are required to be arranged at the vertices of respective two congruent right triangles. However, due to fabrication and assembly tolerances, it is difficult to achieve a perfect congruence.

In addition, structural details of three telescopic rods mentioned in the above document remain unclear from the disclosure thereof. It is inferable that their horizontal rigidity and vertical damping must be high enough to ensure desirable overall stiffness and positional control, which may lead to a high structural complexity.

SUMMARY OF THE INVENTION

In order to solve the above problems, the present invention proposes a debonding leveling device and a debonding method.

To this end, the present invention provides a debonding leveling device for leveling during a process for debonding a first object and a second object, the first and second objects fixed by a first fixation plate and a second fixation plate respectively, wherein the debonding leveling device comprises:

a mounting plate, disposed at an outer side of one of the first and second fixation plates;

a connecting rod assembly fixed around a center position of the mounting plate, the connecting rod assembly connected to the one of the first and second fixation plates sequentially via a sliding pair and a spherical pair coupled to the sliding pair; and at least three elastic assemblies disposed between the mounting plate and the one of the first and second fixation plates, each of the elastic assemblies coupled to the mounting plate and the one of the first and second retention plates.

Preferably, the at least three elastic assemblies are evenly distributed around the spherical pair.

Preferably, each of the elastic assemblies is provided with a pretension adjustment mechanism fastened to the mounting plate or to the one of the first and second fixation plates.

Preferably, each of the pretension adjustment mechanisms comprises a wedge-shaped surface having a vertical height gradually increased along a direction pointing radially outward from the mounting plate, wherein the elastic assemblies being implemented as leaf springs each having a first end fixed to the mounting plate and a second end in contact with the wedge-shaped surface.

Preferably, the wedge-shaped surface is provided with a limiting shoulder at each side thereof along a moving direction of the leaf springs.

Preferably, the sliding pair is a linear bearing or a linear guide.

Preferably, the spherical pair is a spherical bearing, a spherical plain bearing, a floating joint or a universal joint, with the universal joint being preferred to be a 2-DOF universal joint.

Preferably, each of the first and second objects is a wafer or a glass substrate.

The present invention also provides a debonding method using the device as defined above, comprising: disposing the mounting plate above the first fixation plate or under the second fixation plate; and b) exerting an external force along the bonding interface between the first and second objects onto the one of the first and second retention plates not provided with the mounting plate, until the first object is separated from the second object.

Preferably, the debonding method further comprises, between steps a) and b), adjusting the pretension of each of the elastic assemblies is required by leveling.

Preferably, when a change occurs in a profile of the debonding object comprised of the first and second objects, the sliding pair and spherical pair enable one of the first and second fixation plates provided with the mounting plate to adapt to a dynamic change of the debonding object, each of the elastic assemblies exerting a respective pressure on the one of the first and second fixation plates to which the mounting plate is coupled based on the dynamic change of the one of the first and second fixation plates provided with the mounting plate, so that the first object is always kept in parallel to the second object.

Compared to the prior art, the debonding leveling device and debonding method of the present invention offer the following advantages:

1. The combination of the spherical pair and the sliding pair employed in accordance with the present invention allows an adaptation of the leveling objects to dynamic changes of the reference, and the spring assemblies performs leveling for the leveling objects in real time based on the orientation of the reference. As a result, parallelism between the wafer and the glass substrate is always ensured, preventing possible damage to the wafer.

2. The present invention entails a simple structure with only one spherical pair for enabling rotation in the Rx/Ry direction and one sliding pair for enabling movement in the Z-direction. Such a layout is more reasonable, easily usable in practice, and particularly helpful in dynamic leveling applications without requiring an active control.

In these FIG. 10, a wafer; 11, a first fixation plate; 20, a glass substrate; 21, a second fixation plate;

30, a mounting plate; 40, a connecting rod assembly; 50, a sliding pair; 60, a spherical pair; 70, a spring assembly; 71, a pretension adjustment mechanism; 72, a wedge-shaped surface; and 73, a limiting shoulder.

DETAILED DESCRIPTION

Specific embodiments of the present invention will be described in detail below with reference to the accompany drawings so that the above objects, features and advantages thereof will become more apparent and readily understood. Note that the accompanying drawings are provided in a very simplified form not necessarily presented to scale, with the only intention of facilitating convenience and clarity in explaining the embodiments.

Figure 1:
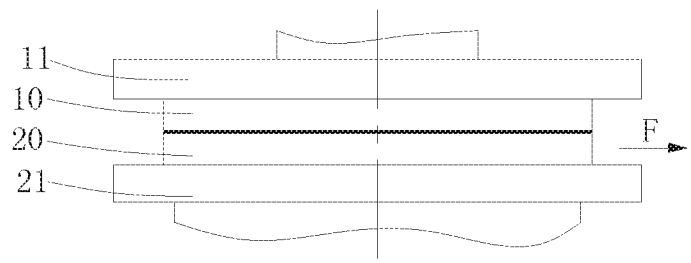
FIG. 1 schematically illustrates objects to be debonded (not debonded yet).
Figure 2:
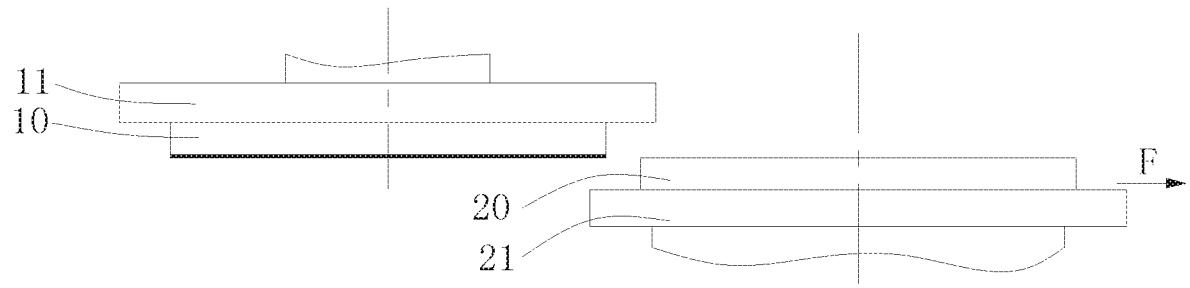
FIG. 2 schematically illustrates debonding objects (having been debonded).
Figure 3:
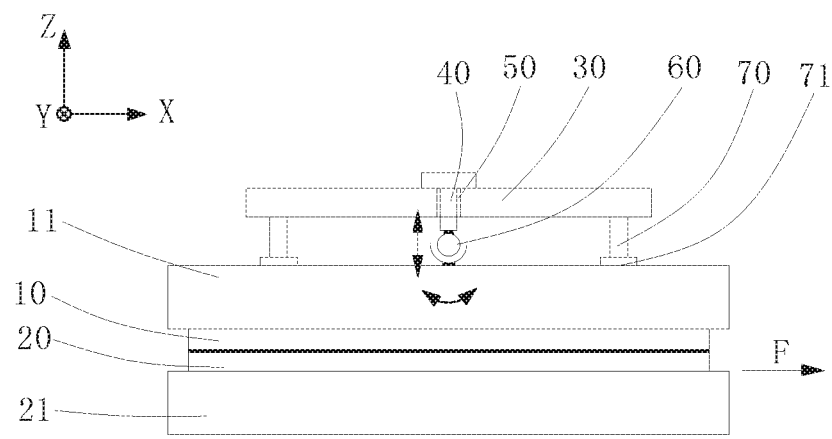
FIG. 3 is a structural schematic of a leveling device for use in debonding according to a specific embodiment of the present invention.
Figure 4:
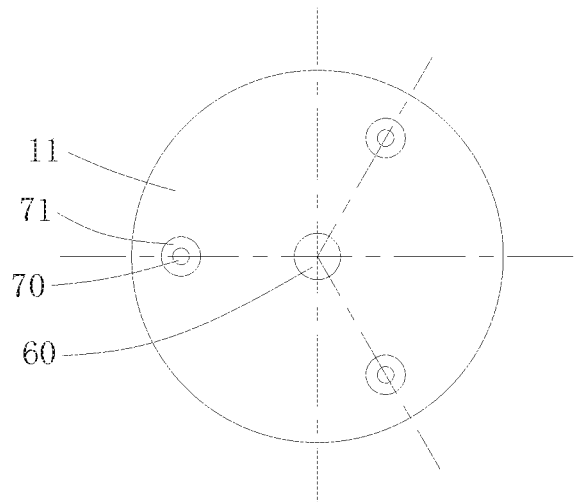
FIG. 4 schematically illustrates a distribution of spring assemblies on a fixation plate in accordance with a specific embodiment of the present invention.

The present invention provides a leveling device for leveling objects during debonding thereof. The objects may be, for example, a bonded wafer comprising a silicon wafer 10 and a glass substrate 20. The silicon wafer 10 and the glass substrate 20 are fixed by a first fixation plate 11 and a second fixation plate 12, respectively. As shown in FIGS. 3 and 4, the leveling device includes a mounting plate 30, disposed at an outer side of one of the first and second fixation plates 11, 12 (on the side away from the debonding objects). In this embodiment, the mounting plate 30 is disposed above the first fixation plate 11.

The leveling device further includes a connecting rod assembly 40 fixed around a center of the mounting plate 30. The connecting rod assembly 40 is connected to the first fixation plate 11 via a sliding pair 50 and a spherical pair 60. The sliding pair 50 is movable in the Z-direction, and the spherical pair 60 is rotatable in both the Rx- and Ry-directions. Specifically, the spherical pair 60 may be implemented as a spherical bearing, a spherical plain bearing, a floating joint, a universal joint or any structure that can act as a spherical pair. The sliding pair 50 may be implemented as a relative sliding displacement between structural members or as a linear bearing, a linear guide or any structure that can act as a sliding pair.

The leveling device further includes at least three spring assemblies, the spring assembly is disposed between the mounting plate 30 and the first fixation plate 11 and each of the spring assemblies is coupled to the mounting plate 30 and the first fixation plate 11. The spring assemblies are distributed evenly around the spherical pair 60.

According to the present invention, a combination of the spherical pair 60 and the sliding pair 50 allows the leveling objects adapting to a dynamic change of the reference. The spring assemblies 70 ensure that the leveling objects perform a leveling according to the orientation of the reference. As a result, parallelism between the silicon wafer 10 and the glass substrate 20 is always ensured, preventing possible damage to the bonded wafer.

Preferably, with continued reference to FIGS. 3 and 4, each of the spring assemblies 70 is provided at the bottom with a pretension adjustment mechanism 71 through which a pretension of the spring of the spring assembly 70 can be changed so that a movement sensitivity of the first fixation plate 11 can be changed.

Figure 5:
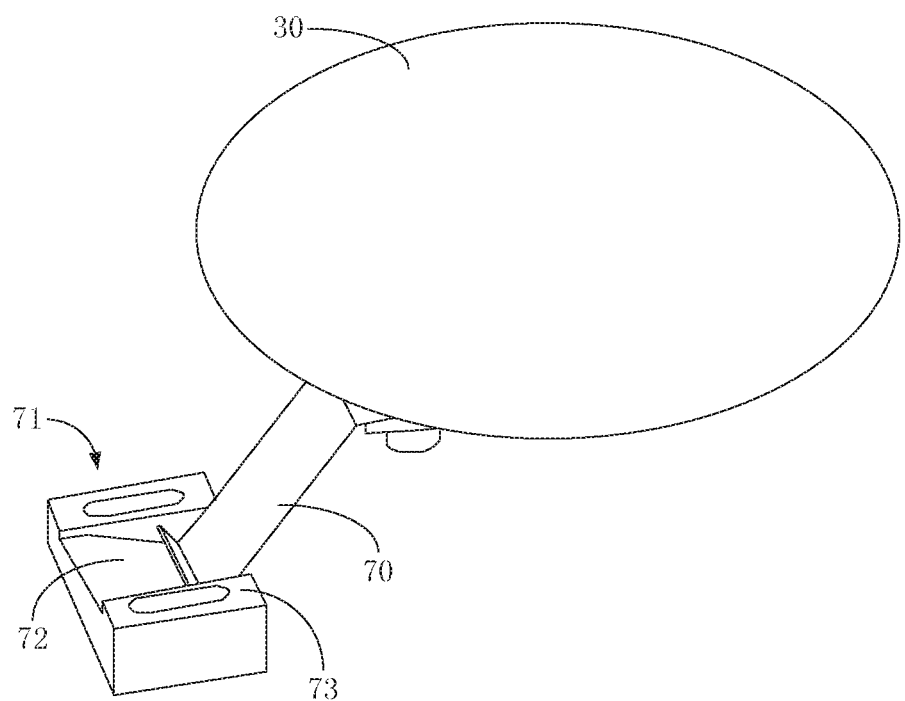
FIG. 5 is a structural schematic of a spring assembly and a pretension adjustment mechanism according to a specific embodiment of the present invention.

Preferably, with particular reference to FIG. 5, each of the pretension adjustment mechanisms 71 according to this embodiment includes a wedge-shaped surface 72. A height of the wedge-shaped surface 72 in the Z direction is gradually increased along a direction pointing radially outward. Accordingly, in this embodiment, the spring assemblies 70 are implemented as leaf springs. Each of the leaf springs has a first end fixed to the mounting plate 30 and a second end in contact with a corresponding one of the wedge-shaped surfaces 72. Relative positional relationships between the wedge-shaped surface s 72 and the leaf springs may be individually adjusted to change pressures exerted by the leaf springs onto the first fixation plate 11.

Preferably, with continued reference to FIG. 5, two sides of the wedge-shaped surface 72 are respectively provided with a limiting shoulder 73 located at the moving direction of the leaf springs to limit a horizontal movement of the leaf springs and hence a rotational movement of the first fixation plate 11 in the Rz-direction.

With continued reference to FIGS. 3 and 4, the present invention also provides a debonding method using the leveling device as defined above. The mounting plate 30 may be disposed either above the first fixation plate 11 on which the silicon wafer 10 is retained or under the second fixation plate 21 on which the glass substrate 20 is retained. An external force F is applied to one fixation plate of the first fixation plate 11 and the second fixation plate 21 which is not provided with the mounting plate 30 along the bonding interface between the silicon wafer 10 and the glass substrate 20, until the silicon wafer 10 is separated from the glass substrate 20.

Specifically, with the mounting plate 30 being disposed above the first fixation plate 11 as an example. When the external force F is applied to the second fixation plate 21, the second fixation plate 21 and the glass substrate 20 retained thereon are driven to move in the same direction as the force F, as shown in FIG. 3. The mounting plate 30 remains stationary in the whole device and hence the first fixation plate 11 and the silicon wafer 10 retained thereon remain stationary. As a result, the silicon wafer 10 is gradually separated from the glass substrate 20. Throughout the separation process, the first fixation plate 11 and the silicon wafer 10 retained thereon accomplish a self-adaptive leveling so as to adapt the orientations of the second retention plate 21 and the glass substrate 20 retained thereon in real time or, an axial movement (i.e., in the Z direction) or a rotational movement around the spherical pair 60 (i.e., in the Rx/Ry-direction) of the connecting rod assembly 40.

Preferably, when the profile of the debonding objects comprised of the wafer 10 and the glass substrate 20 changes, the sliding pair 50 and spherical pair 60 enable the first fixation plate 11 to adapt to the dynamic change of the debonding object. The spring assemblies 70 based on the dynamic change exert different pressures to the surface of the first retention plate 11, so that the silicon wafer 10 is always kept in parallel with respect to the glass substrate 20. Specifically, upon the attitude of the silicon wafer 10 or the glass substrate 20 has a Rx/Ry-directional rotation or a Z-directional displacement, as the position of the mounting plate is fixed, through the sliding pair 50 and the spherical pair 60, the first fixation plate 11 is enabled to rotate around the spherical pair 60 in Rx/Ry direction, or to move along the sliding pair 50 in the Z direction. Of course, the spherical pair 60, the sliding pair 50 and the connecting rod assembly 40 are stiff enough to ensure relative positional accuracy between the first fixation plate 11 and the mounting plate 30.

In summary, a debonding leveling device and a debonding method are provided by the present invention. The device comprises a mounting plate 30 which is disposed at an outer side of the fixation plate on which the silicon wafer 10 or the glass substrate 20 is retained; and a connecting rod assembly 40 which is fixed around the center of the mounting plate 30 and connected, via the sequentially connected sliding pair 50 and spherical pair 60, to the fixation plate; at least three elastic assemblies which are all disposed between, and respectively coupled to, the mounting plate 30 and the fixation plate, wherein the spring assemblies 70 are evenly distributed around the spherical pair 60. The combination of the spherical pair 60 and the sliding pair 50 allows leveling objects to adapt dynamic changes of the reference, and the spring assemblies 70 can perform a leveling for the leveling objects in real time based on the orientation of the reference. This entails a simple structure with a reasonable layout, which is easy to use in practice and is particularly helping in dynamic leveling applications without requiring an active control.

It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A debonding leveling device for leveling during a process for debonding a first object and a second object, the first and second objects fixed to a first fixation plate and a second fixation plate, respectively, wherein the debonding leveling device comprises:
   a mounting plate, disposed at an outer side of one of the first and second fixation plates;
   a connecting rod assembly fixed to the mounting plate around a center position, the connecting rod assembly connected to the one of the first and second fixation plates sequentially via a sliding pair and a spherical pair connected to the sliding pair; and
   at least three elastic assemblies disposed between the mounting plate and the one of the first and second fixation plates, each of the elastic assemblies coupled to the mounting plate and the one of the first and second fixation plates.

2. The debonding leveling device of claim 1, wherein the at least three elastic assemblies are evenly distributed around the spherical pair.

3. The debonding leveling device of claim 1, wherein each of the elastic assemblies is provided with a pretension adjustment mechanism fastened to the mounting plate or to the one of the first and second fixation plates.

4. The debonding leveling device of claim 3, wherein the pretension adjustment mechanism comprises a wedge-shaped surface having a vertical height gradually increased along a direction pointing radially outward from the mounting plate, and wherein the elastic assemblies are implemented as leaf springs each having a first end fixed to the mounting plate and a second end in contact with the wedge-shaped surface.

5. The debonding leveling device of claim 4, wherein the wedge-shaped surface is provided with a limiting shoulder at each side thereof along a moving direction of the leaf spring.

6. The debonding leveling device of claim 1, wherein the sliding pair is a linear bearing or a linear guide.

7. The debonding leveling device of claim 1, wherein the spherical pair is a spherical bearing, a spherical plain bearing, a floating joint or a universal joint.

8. The debonding leveling device of claim 7, wherein the universal joint is a universal joint with two degree-of-freedom.

9. The debonding leveling device of claim 1, wherein each of the first and second objects is a wafer or a glass substrate.

10. A debonding method using the debonding leveling device of claim 1, comprising:
   a) disposing the mounting plate above the first fixation plate or under the second fixation plate; and
   b) exerting an external force along a bonding interface between the first and second objects onto one of the first and second fixation plates not disposed with the mounting plate, until the first object is separated from the second object.

11. The debonding method of claim 10, further comprising, between the steps a) and b), adjusting a pretension of each of the elastic assemblies.

12. The debonding method of claim 10, comprising keeping the first object in parallel with respect to the second object by the elastic assemblies.

* * * * *